United States Patent [19]

Smith, Jr. et al.

[11] Patent Number: 5,738,071
[45] Date of Patent: Apr. 14, 1998

[54] APPARATUS AND METHOD FOR SENSING MOVEMENT OF FUEL INJECTOR VALVE

[75] Inventors: Marshall E. Smith, Jr., Eaton Park; Peter U. Wolff; Richard W. Stettler, both of Winter Haven, all of Fla.

[73] Assignee: Wolff Controls Corporation, Winter Haven, Fla.

[21] Appl. No.: 760,104

[22] Filed: Dec. 3, 1996

[51] Int. Cl.⁶ .................. F02D 31/00; F16K 37/00
[52] U.S. Cl. .................. 123/357; 123/494; 137/554
[58] Field of Search .................. 123/357, 458, 123/494; 73/117.3, 119 R, 119 A; 137/554; 251/129.1

[56] References Cited

U.S. PATENT DOCUMENTS

| | | |
|---|---|---|
| 4,254,653 | 3/1981 | Casey et al. . |
| 4,328,697 | 5/1982 | Tumber et al. . |
| 4,402,294 | 9/1983 | McHugh et al. . |
| 4,403,585 | 9/1983 | Ohie . |
| 4,438,496 | 3/1984 | Ohie .................. 123/458 |
| 4,553,207 | 11/1985 | Veneziano . |
| 4,573,349 | 3/1986 | Slindee . |
| 4,667,511 | 5/1987 | Mausner . |
| 4,770,346 | 9/1988 | Kaczynski . |
| 4,788,960 | 12/1988 | Oshizawa .................. 123/357 |
| 4,793,313 | 12/1988 | Paganon et al. . |
| 4,825,369 | 4/1989 | Oshizawa .................. 123/357 |
| 4,852,535 | 8/1989 | Rollenitz et al. . |
| 4,903,669 | 2/1990 | Groff et al. . |
| 5,000,042 | 3/1991 | Luebbering . |
| 5,005,404 | 4/1991 | Ricco et al. . |
| 5,109,885 | 5/1992 | Tauscher .................. 137/554 |
| 5,116,342 | 5/1992 | Schmidt et al. . |
| 5,157,967 | 10/1992 | Wieczorek .................. 73/119 A |
| 5,197,429 | 3/1993 | Kita . |
| 5,241,858 | 9/1993 | Wieczorek et al. . |
| 5,282,570 | 2/1994 | Johnson et al. . |
| 5,311,903 | 5/1994 | Poulin .................. 137/554 |
| 5,365,791 | 11/1994 | Padula et al. . |
| 5,433,109 | 7/1995 | Mayer-Dick et al. .................. 73/119 A |
| 5,524,484 | 6/1996 | Sullivan . |
| 5,583,434 | 12/1996 | Moyers et al. .................. 137/554 |
| 5,595,215 | 1/1997 | Wallace et al. .................. 137/554 |

*Primary Examiner*—Thomas N. Moulis
*Attorney, Agent, or Firm*—Allen, Dyer, Doppelt, Milbrath & Gilchrist, P.A.

[57] ABSTRACT

An apparatus and methods are provided for sensing movement of a fuel injector valve of a fuel injection system. The apparatus preferably includes a fuel pump for pumping fuel to flow to a combustion chamber of an engine and a first valve positioned in fluid communication with the fuel pump for allowing fuel to flow directly into the combustion chamber when in an open position. A second valve is positioned in fluid communication with the first valve and the fuel pump for allowing fuel to flow to the first valve when in an open position. A second valve actuator is positioned responsive to desired fuel injection for actuating the second valve. A sensor is positioned to sense movement of the first and second valves and the actuation of the second valve actuator. A movement differentiator is preferably positioned responsive to the sensor for differentiating a time of moving of the first valve from the time of moving of the second valve and the actuation of the second valve actuator.

31 Claims, 4 Drawing Sheets

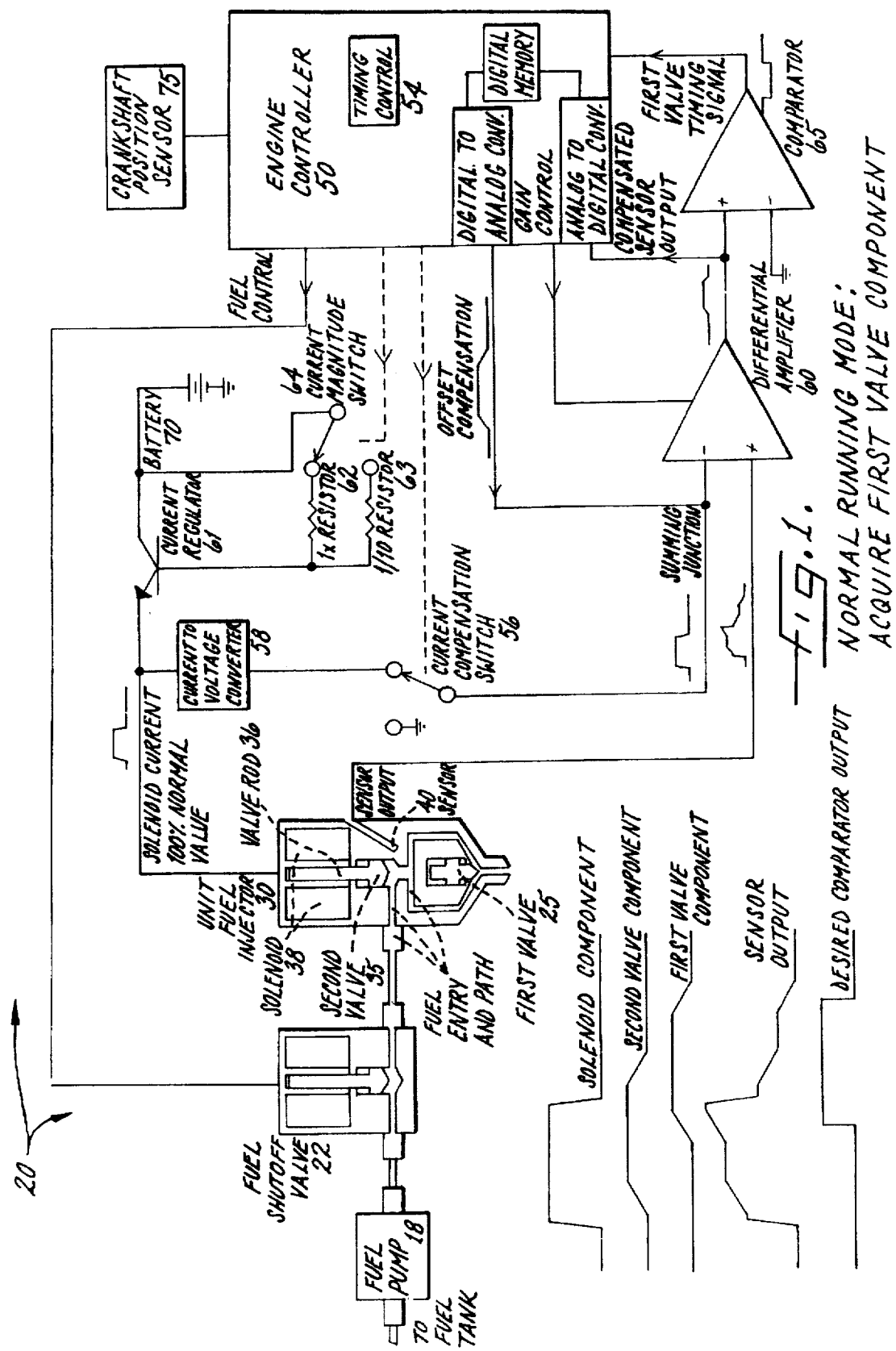

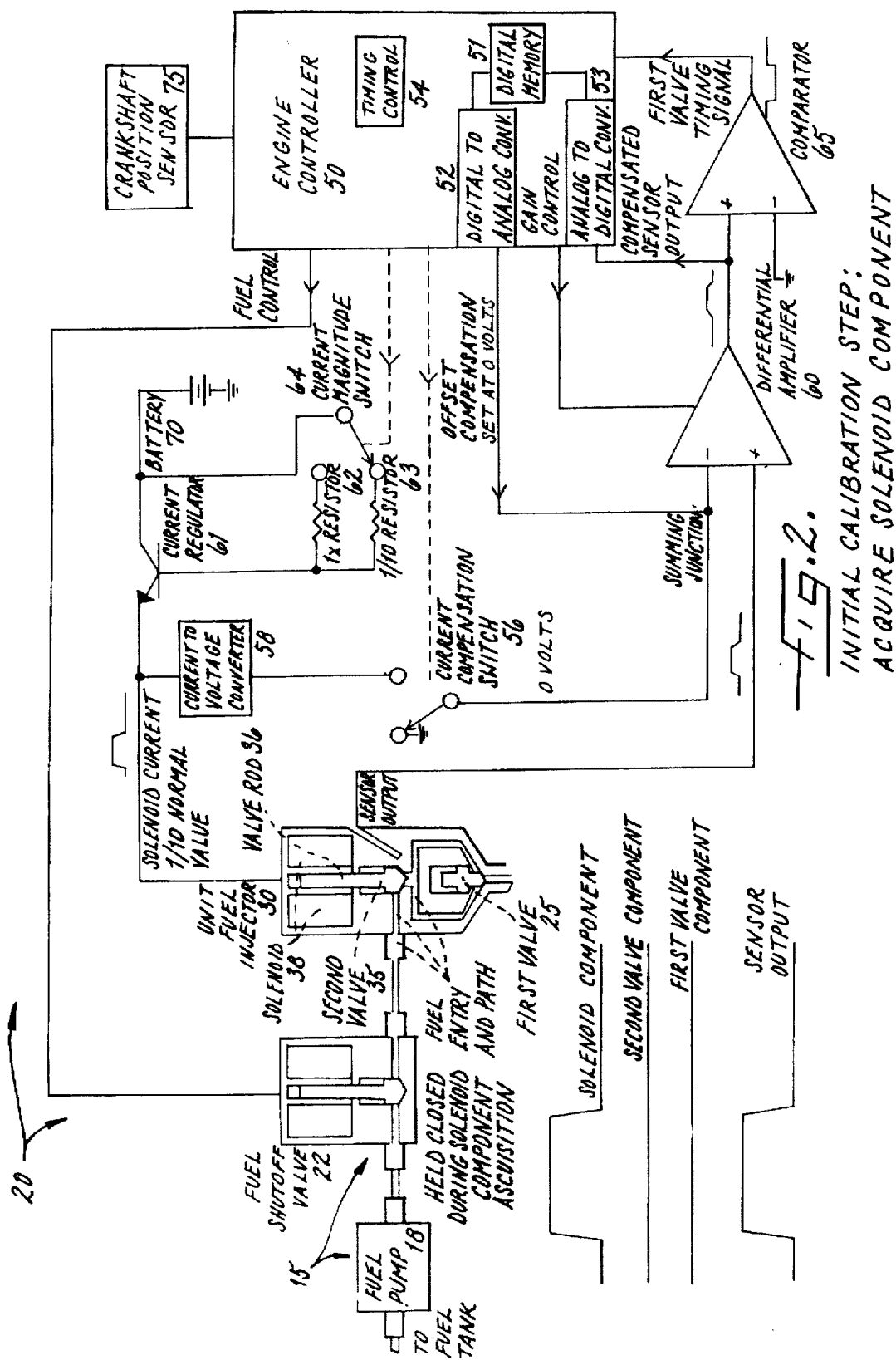

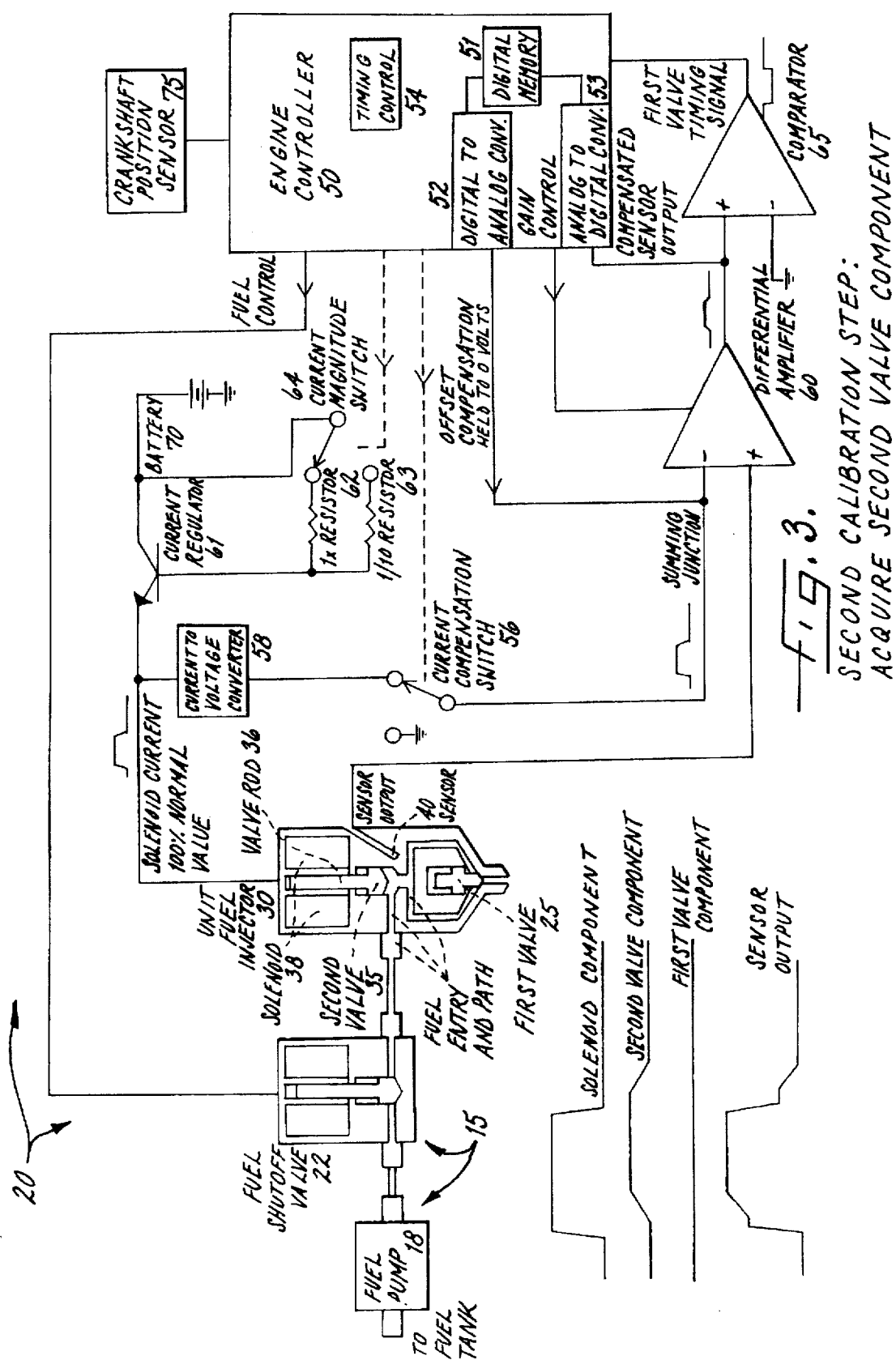

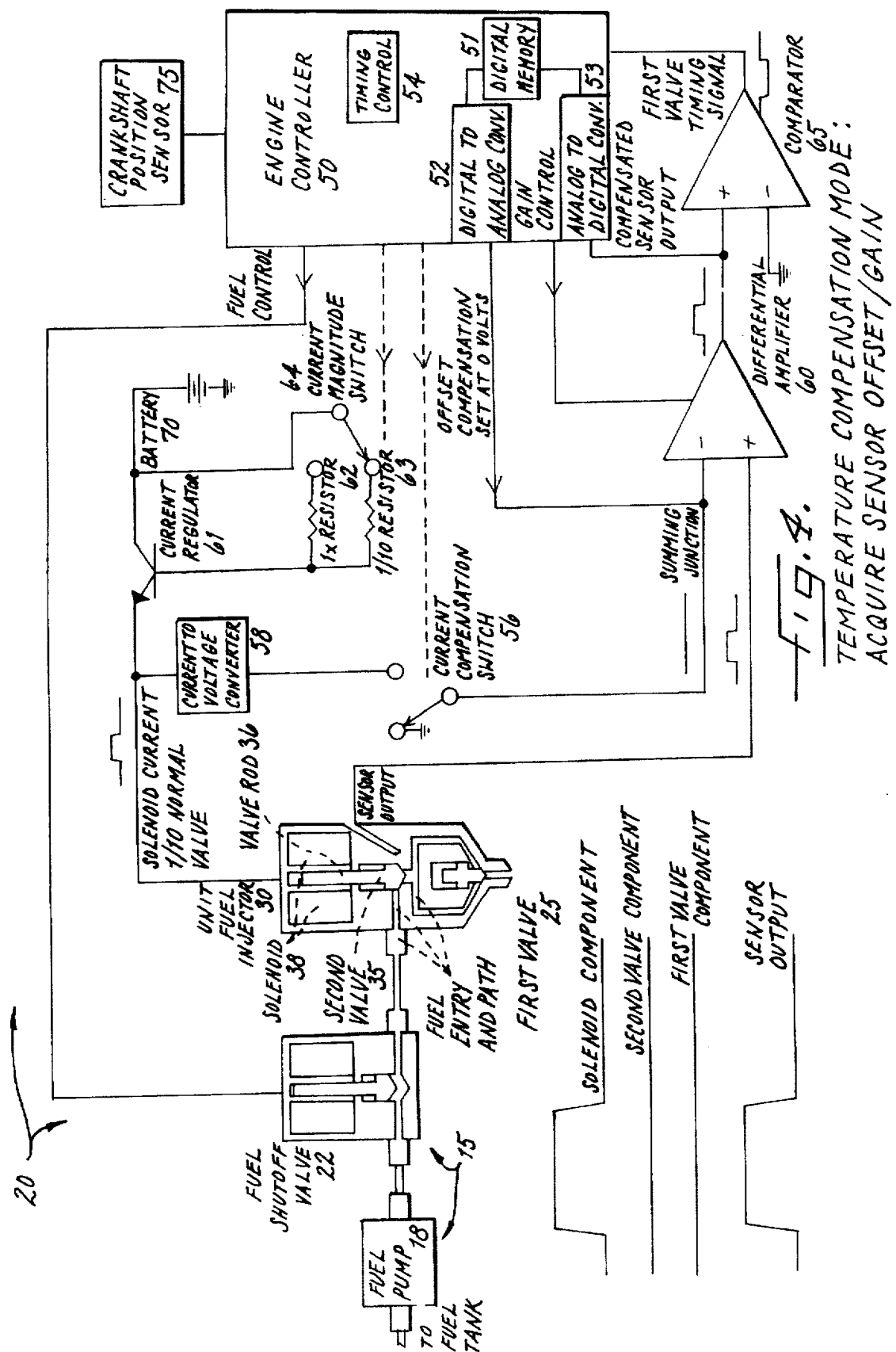

APPARATUS AND METHOD FOR SENSING MOVEMENT OF FUEL INJECTOR VALVE

FIELD OF THE INVENTION

The present invention relates to the field of vehicle engines and, more particularly, to fuel systems for vehicle engines.

BACKGROUND OF THE INVENTION

Over the years, various fuel enhancing systems for combustion engines have been developed. One of the noteworthy developments has been the fuel injection systems for combustion engines. A diesel engine type of combustion engine, however, has no spark plugs—the heat of compression ignites the fuel mixture. The timing of the ignition is controlled by injecting fuel at high pressure directly into the combustion chamber at just the right moment. A recent fuel injection system for a diesel engine, for example, conventionally includes a fuel pump for pumping fuel into an engine combustion chamber and a needle valve positioned in fluid communication with the fuel pump for allowing fuel to flow into the combustion chamber when in an open position. A second valve is positioned in fluid communication with the needle valve and the fuel pump for allowing fuel to flow to the needle valve at high pressure when in an open position, e.g., from the fuel pump to the needle valve. A solenoid can be positioned adjacent the second valve for actuating the second valve responsive to the magnetic field generated by the solenoid. A magnet can be mounted to the needle valve, and a Hall-effect sensor can be positioned responsive to movement of the needle for sensing movement of the magnet when opening of the needle valve to thereby control the timing of the ignition process.

These type of fuel injecting systems, however, still have problems with controlling the timing of the ignition process. Accordingly, other systems have been developed to attempt to control the timing of the ignition process in engines, including using various types of hydraulic control and signal conditioning. For example, these attempts to solve the timing process control problems have focused on changing the entire construction of a fuel injection system, have focused on changing the type or positioning of sensors used to sense movement of a valve, and have focused on problems such as wear, drift, lift or movement, and malfunction of a valve itself. These attempts, however, are often complex and expensive and often fail to recognize system constraints in addressing the problems. These prior attempts also either fail to recognize or fail to adequately address the trade-off between size, cost, and accuracy of systems that perform signal conditioning.

SUMMARY OF THE INVENTION

With the foregoing in mind, the present invention advantageously provides a relatively inexpensive and simple apparatus and methods for controlling the timing of the ignition process in a fuel injection system of an engine. The present invention provides an apparatus and methods that advantageously recognizes system constraints and adjusts for these constraints. An apparatus according to the present invention can also advantageously be adapted or retrofitted into conventional fuel injecting systems. An apparatus and method of the present invention additionally provide more accuracy and reliability for determining the movement and timing of the movement of a first valve or needle valve in a fuel injection system. An apparatus of the present invention further can take the position sensor outside of the fuel cavity and can allow the sensors to be smaller.

The operation of a fuel injector on a compression ignited internal combustion engine, for example, generally depends on the hydraulic effects that result in an unpredictable delay between the initiation of the fuel injection event and the actual start of the injection of fuel into the combustion chamber. An engine controller must know this delay to determine how much time to allow for the needle valve to open. To determine this delay, a magnetic position sensor is often placed adjacent the needle valve.

The present invention also recognizes at least one problem as being encountered when using a magnetic position sensor in unit injectors. There are two devices in the unit fuel injector that can generate magnetic fields which are also sensed by the magnetic position sensor. One field is generated by a solenoid, and the second field is generated by a second valve that moves responsive to the solenoid being energized to allow fluid to flow directly to the needle valve, e.g., a first valve. Because these two control the movement of the needle valve, the magnetic fields of these two items are changing at the same time that the magnetic field of the needle valve is attempting to be sensed. The present invention removes or cancels these components from the output of the magnetic position sensor to thereby derive an accurate needle valve position signal. To accomplish this, the magnetic fields of the two components, e.g., the solenoid and the second valve, are determined separately from the magnetic field generated by the needle valve.

Another problem recognized and addressed by the present invention is that a change in the temperature of the position sensor causes a proportional change in the sensor output. This change affects the sensor output in two ways. The first change is in the output signal baseline or offset. This offset is the output of the magnetic sensor when the actuator, e.g., a solenoid, is not energized and when both the first and second valves are at rest. The second change is in the signal gain. This gain is the amount of sensor output voltage generated for a specific amount of magnetic flux density, usually expressed as volts per kiloGauss. Although these changes are generally due to the same changes in conduction mechanisms in the sensor, the effects of these changes must be compensated for separately. Accordingly, the present invention includes compensation calibrating means for compensatingly calibrating for these changes.

More particularly, an apparatus for sensing movement of a fuel injector valve preferably includes a fuel pump for pumping fuel to flow to a combustion chamber of an engine and first valve means positioned in fluid communication with the fuel pump for allowing fuel to flow directly into the combustion chamber when in an open position. Second valve means preferably are positioned in fluid communication with the first valve means and the fuel pump for allowing fuel to flow to the first valve means when in an open position. Second valve actuating means are positioned responsive to desired fuel injection for actuating the second valve means. Sensing means preferably is positioned responsive to movement of the first and second valve means and to actuation of the second valve actuating means for sensing movement of the first and second valve means and actuation of the second valve actuating means. The apparatus also preferably includes movement differentiating means responsive to the sensing means for differentiating a time of movement of only the first valve means from movement of the second valve means and actuation of the second valve actuating means. Alternatively, the sensing means and the movement differentiating means advantageously can also be positioned responsive only to an actuation means, such as a solenoid, where two valves are not involved or can be positioned responsive only to second valve means where another type of actuation is used.

An apparatus and methods according to the present invention advantageously senses movement of a first valve of a valve system having the first valve and a second valve positioned upstream from and in fluid communication with the first valve. A method preferably includes sensing a first valve output signal representative of actuation of the first valve positioned in fluid communication with a fuel pump which pumps fuel to flow to a combustion chamber of an engine, and subtracting a second valve calibration output signal representative of actuation of the second valve positioned upstream from and in fluid communication with the first valve and in fluid communication with the fuel pump for allowing fuel to flow to the first valve from the first valve output signal to thereby provide a first valve movement signal representative of a time of movement of the first valve.

Another method for sensing movement of a first valve of a valve system having the first valve, a second valve positioned upstream from and in fluid communication with the first valve, and second valve actuating means for actuating the second valve is also included according to the present invention. This method preferably includes sensing a second valve actuating signal from the second valve actuating means, sensing a first valve output signal from the first valve, and subtracting the second valve actuating signal from the first valve output signal to thereby provide a first valve movement signal representative of a time of movement of the first valve.

An apparatus and methods for sensing movement of a valve can advantageously be used in many valve systems, for example, where a solenoid is used to actuate a valve or is otherwise used in some associated relationship in the valve system. In an embodiment of an apparatus according to the present invention, such as a fuel injection system, some fuel injectors have an actuator, e.g., a solenoid, that pulls a valve rod into the solenoid. The valve rod has an end attached to the second valve. The magnetic field of the solenoid is therefore a function of the current through the solenoid, the number of windings of the solenoid, and the physical size of the solenoid. This field is also increased by the increase in permeability in the center of the solenoid as the rod moves up into the solenoid. To differentiate or determine the position of the first valve of the apparatus, for example, the components of the magnetic field at a Hall-effect sensor that are caused by both the characteristics of the solenoid and its electrical current and the components of the magnetic field caused by the change in permeability of the solenoid as the upper valve rod enters the center of the solenoid can be advantageously subtracted from the overall magnetic field caused by the two components above and the component of the magnetic field generated by a magnet mounted to the moving first valve.

BRIEF DESCRIPTION OF THE DRAWINGS

Some of the objects and advantages of the present invention having been stated, others will become apparent as the description proceeds when taken in conjunction with the accompanying drawings in which:

FIG. 1 is a schematic and graphical view of an apparatus for sensing movement of a fuel injector valve of a fuel injector system during a normal operating mode according to the present invention;

FIG. 2 is a schematic and graphical view of an apparatus for sensing movement of a fuel injector valve of a fuel injector system during a first calibration mode according to a first embodiment of the present invention;

FIG. 3 is a schematic and graphical view of an apparatus for sensing movement of a fuel injector valve of a fuel injector system during a second calibration mode according to a first embodiment of the present invention; and FIG. 4 is a schematic and graphical view of an apparatus for sensing movement of a fuel injector valve of a fuel injector system during a third calibration mode according to a first embodiment of the present invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime and double prime notation are used to indicate similar elements in alternative embodiments.

FIG. 1 illustrates a schematic and graphical view of an apparatus 20 for sensing movement of first valve means, e.g., a first valve 25, of a valve system, such as a fuel injection system 15, having second valve means, e.g., a second valve 35, and valve actuating means 38, e.g., a valve actuator, for actuating the first valve 25 according to the present invention. By way of example, the apparatus 20 and methods according to the present invention preferably have at least one embodiment of a fuel injection system 15 as illustrated in the drawings and as described further herein. It will be understood by those skilled in the art, however, that an apparatus 20 and methods according to the present invention can also be applicable to other valve systems particularly where a solenoid 38 or other valve actuator creates a need to differentiate movement of the valve 35 from the valve actuator 38 and/or to differentiate movement of a second valve 35 from a first valve 25. The present invention also advantageously recognizes at least one problem as being encountered when using sensing means such as a magnetic position sensor 40 in unit injectors 30 of a fuel injection system 15. There are two devices in the unit fuel injector 30 that can generate magnetic fields which are also sensed by the magnetic position sensor 40. One field is generated by a solenoid 38, and the second field is generated by a second valve 35 that moves responsive to the solenoid 38 being energized or activated to thereby allow fluid to flow directly to the needle valve 25, e.g., a first valve. Because the solenoid 38 and the second valve 35 control the movement of the needle valve 25, the magnetic fields of the solenoid 38 and the second valve 35 are changing at the same time that the magnetic field of the needle valve 25 is attempting to be sensed by the position sensor 40. The present invention advantageously removes or cancels these components from the output of the magnetic position sensor 40 to thereby derive an accurate needle valve position signal. To accomplish this, the magnetic fields of the two components, e.g., the solenoid 38 and the second valve 35, are determined separately from the magnetic field generated by the needle valve 25.

Another problem recognized and addressed by the present invention, and as best illustrated in FIG. 4, is that a change in the temperature of the position sensor 40 causes a proportional change in the sensor output. This change affects the sensor output in two ways. The first change is in the output signal baseline or offset. This offset is the output of the magnetic sensor 40 when the solenoid 38 is not energized and when both the first and second valves 25, 35 are at rest. The apparatus 20 is illustrated as having a solenoid 38 as an actuator, but it will be understood by those skilled in the art that other actuators can also be used according to the present invention and that the present invention can also be applicable to a coil(s), an inductor(s), or other circuitry that generates a magnetic field either to actuate a valve 35 or where such a coil, inductor, solenoid or the like is used in such a system. The second change is in the signal gain. This gain is the amount of sensor output voltage generated for a specific amount of magnetic flux density, usually expressed as volts per kiloGauss. Although these changes are generally due to the same changes in conduction mechanisms in the sensor 40, the effects of these changes must be compensated for separately. The signal from the sensor 40 is an analog signal proportional to the position of the needle valve 25, and the signal required for an engine controller 50, e.g., preferably including at least one processor for processing signals, is a digital signal that is on when the needle valve 25 is open. This requires a voltage comparator 65 to be used that switches to an "on" position when the needle valve 25 moves a specific percentage of the distance that it attains when fully open. The offset corresponds to the position of the needle valve 25 when closed, and the gain defines the sensor output when the needle valve 25 is fully open. Both factors must be taken into account when determining the voltage level which causes the comparator 65 to switch.

For example, a sensor 40 can generate one (1) Volt when the needle valve is closed and five (5) Volts when fully open. A comparator 65 that switches when the needle valve 25 opens to 10% of its fully open position would then be set to switch a value corresponding to 10% of the difference between the gain and the offset (.e.g., (0.1×(5−1)+1)=1.4 Volts). If the sensor offset and gain change, this switching voltage must also be changed, or the output of the sensor 40 must be adjusted back to a specific offset and gain if the switching voltage is to remain unchanged. Either method requires the determination of the response of the sensor offset and gain to changes in temperature.

As best illustrated in FIGS. 1–4, the apparatus 20 for sensing movement of a fuel injector valve, e.g., the first valve 25, of a fuel injection system 15 preferably includes a fuel injector 30 that has the first valve 25 positioned to receive fuel from a fuel pump 18 and to flow directly to a combustion chamber of an engine. A second valve 35 preferably is positioned upstream from and in fluid communication with the first valve 25. The second valve 35 is also preferably in fluid communication with the fuel pump 18. Valve actuating means 38, such as a solenoid, coil, or inductor, is preferably positioned to actuate the second valve 35. The valve actuating means 38 is illustrated as a solenoid that pulls a valve rod 36 into medial portions of the solenoid 38. The valve rod 36 has an end attached to the second valve 35. The magnetic field of the solenoid 38 is therefore a function of the current through the solenoid 38, the number of windings of the solenoid 38, and the physical size of the solenoid 38. This field is also increased by the increase in permeability in the center of the solenoid 38 as the valve rod moves up into the solenoid 38.

To determine the position of this needle valve 25, the components of the magnetic field at a sensor 40, e.g., a transducer such as a Hall-effect sensor, that are caused by both the characteristics of the solenoid 38 and its electrical current and the components of the magnetic field caused by the change in permeability of the solenoid 38 as the valve rod 36 of the second valve 35 enters the center of the solenoid 38, e.g., movement of the second valve 35, are subtracted from the overall magnetic field caused by the two components above and the component of the magnetic field generated by a magnet mounted to the moving needle valve 25 or simply the movement of the needle valve 25 itself. A Hall-effect sensor 40 used as a transducer advantageously senses the magnetic field applied across a current carrying material or changes in the magnetic field caused by movement of the material. As understood by those skilled in the art, other transducers such as a magnetorestrictive transducer that senses changes in magnetic flux can be used as well according to the present invention.

To operationally accomplish this, movement differentiating means, e.g., a movement differentiator, is preferably positioned responsive to the sensing means for differentiating a time of movement of only the first valve means 25 from movement of the second valve means 35 and actuation of the second valve actuating means 38. The movement differentiator preferably includes processing means, e.g., a processing circuit, positioned responsive to the sensing means 40 for processing a signal representative of actuation of the second valve actuating means 38 and a signal representative of movement of the first valve 25 to thereby provide a first valve movement timing signal representative of a time of opening of the first valve. As illustrated, the movement differentiator preferably has an electrical processing circuit that accomplishes this function such as the circuit illustrated in FIGS. 1–4. This circuit, for example, includes primarily portions of the engine controller 50, a memory device 51, a differential amplifier 60, a comparator 65, a timing controller 54, a crankshaft position sensor 75 for establishing a timing signal, an analog-to-digital converter 53 and a digital-to-analog converter 52, switches 56, 64, resistors 62, 63, a current to voltage converter circuit 58, and a current regulator, e.g., a transistor 61, all connected as illustrated and as described further herein. It will be understood by those skilled in the art that other processors and processing circuits having hardware or a combination of hardware and software can also be used to accomplish this function.

The movement differentiating means preferably includes subtracting means, e.g., a subtractor, a portion of an engine controller 50, or a processing circuit such as illustrated, positioned responsive to a movement output signal generated by the sensing means 40, a second valve output signal generated by the second valve means 35, and a second valve actuating output signal generated by the second valve actuating means 38 for subtracting the second valve output signal and the second valve actuating output signal from the movement output signal to thereby provide a first valve movement timing signal representative of a time of opening of the first valve means 25. For illustrative purposes, output signals of the sensor 40 which include a first valve component, a second valve component, and an actuator or solenoid component are graphically illustrated in FIGS. 1–4 and are described in conjunction with the apparatus 20 further herein.

As best illustrated in FIGS. 2–3, the movement differentiating means preferably further includes calibration generating means in communication with the subtracting means for generating a calibration signal representative of the movement of the second valve means and the actuation of the second valve actuating means and storing means 51 responsive to the calibration generating means for storing the calibration signal. The calibration generating means preferably includes a fuel shutoff valve 22 positioned in fluid communication with the fuel pump 18 and the second valve means 35 for preventing fuel to flow to the second valve means 35 when in a closed position and for allowing fuel to flow to the second valve means 35 when in an open position and control means, e.g. the engine controller 50 and associated solenoid drive circuitry 58, 61, 62, 63, 64, 70, connected to the second valve actuating means 38 for controlling actuation of the second valve actuating means 38 when the fuel shutoff valve 22 and the second valve means 35 are each in a closed position and when the fuel shutoff valve 22 is in a closed position and the second valve means 35 is in an open position to thereby generate the calibration signal. The control means also is further positioned in communication with the fuel shutoff valve 22 for controlling the opening and closing of the fuel shutoff valve 22.

To determine the sensor 40 response caused only by the movement of the needle valve 25 and to eliminate the effect of the magnetic fields of the solenoid 38 and the second valve 35, the system 15 actuates the solenoid 38 and second valve 35 separately while holding the needle valve 25 closed. The results are two sensor outputs that each exclude the effect of the needle valve movement. These two sensor output components are then subtracted from the overall sensor output to derive the magnetic field generated solely by the movement of the needle valve 25.

To operationally accomplish this, and as best illustrated in FIGS. 2–4, two steps are performed. First, because the solenoid magnetic field is directly proportional to the amount of current being passed through it, this current is sampled by the current-to-voltage converter 58 and connected to one input of a differential amplifier 60. The sensor output is connected to the other input, and the resulting output of the differential amplifier 60 is the sensor output minus the component generated by the solenoid magnetic field. This has the added benefit of allowing the solenoid current to be set at any level or allowing any amount of noise to be present in the solenoid current without detracting from the accuracy of this compensation method.

Second, the second valve 35 preferably is actuated directly by the solenoid 38. Permeable material attached to the second valve 35 moves into the solenoid 38 when the valve opens, and moves out when the valve 35 closes. This causes a corresponding increase or decrease in the solenoid's magnetic field directly proportional to the movement of the second valve 35. Unlike the solenoid 38, there is no other signal such as solenoid current that can be used to directly determine the magnetic field generated by the second valve 35. The speed of movement of the second valve 35 is determined by a complex set of factors, including the amount of force generated by the solenoid 38, the amount of time that the magnetic field takes to become strong enough to open the valve, the amount of force generated by the spring holding the valve closed, friction, and the mass of the valve. There will be a specific amount of time between energizing and de-energizing of the solenoid 38 and the start of movement of the second valve 35. Also, there will be a specific amount of time that the second valve 35 takes to become fully open or closed after it starts moving. Mechanical wear will cause the effect of these factors to change significantly over the life of the injector and thereby significantly change the times involve. During normal periods of operation, however, extending to hundreds of hours, these factors will change very little. The operation of the second valve 35 can therefore generally be assumed to be constant from the time the engine is started to the time it is shut off. This information will be valid over the full period of operation of the engine.

The signal component caused by the movement of the second valve 35 is determined during start-up and stored in storing means, e.g., digital memory 51, in the engine controller 50 as a table relating valve position versus time. The timing signal, for example, can be determined or obtained from the rotational timing of the engine crankshaft. This data file or table can contain information about the movement of the second valve 35 as it starts from rest and opens, with samples taken rapidly enough to determine the number of times it bounces against its stop or any other significant moves it may make. Provided the composition of the fuel does not change significantly, these movements should be essentially the same each time the second valve 35 opens. During subsequent operation, these values are regenerated using the same timing and then subtracted from the sensor signal to eliminate the effect of the movement of the second valve 35.

Acquiring the sensor 40 response caused by the second valve 35 requires that the needle valve 25 be held closed while the second valve 35 is being actuated. A calibration can be performed wherein the injector 30 is "dry-fired" or actuated as normal except that no fuel is supplied to the fuel injector 30. A fuel shutoff valve 22, e.g., also including a solenoid, can be positioned upstream from the second valve 35 and between the second valve 35 and the fuel pump 18. This prevents the first valve 25, e.g., a needle valve 25, from opening. The only magnetic field generated is due to the magnetic field caused by the solenoid 38 and to the change in permeability caused by the movement of the second or upper valve 35. The needle valve 25 is actuated directly by fluid compression. The fuel is compressed by a fuel pump 18 and delivered through the fuel shutoff valve 22 to the second valve 35. The second valve 35 is positioned between the shutoff valve 28 and the needle valve 25. When the second valve 35 opens, it allows the pressurized fuel to flow from the fuel pump 18 to the needle valve 25 and thus opens the needle valve 25.

During startup, the response of the second valve 35 is determined by holding the fuel shutoff valve 28 closed so that fuel at the injector 30 is not compressed. The needle valve 25 does not open. The sensor output is only affected by the magnetic field of the solenoid 38 and the second valve 35. The solenoid component is subtracted from the sensor output using the method described above, and the result is the component caused only by the movement of the second valve 35. This is then stored in a memory device 51.

The fuel shutoff valve 28 is then activated, and during subsequent rotations of the engine, the needle valve 25 opens as required. The components of the sensor output caused by the solenoid 38 and the second valve 35 are then subtracted yielding a resulting signal that is proportional only to the movement of the needle valve 25. Because this requires a significant amount of power during startup, this process can be postponed if the engine controller 50 senses that the voltage or power of the battery 70 is low, that the engine is very cold, or other reasons that can require a significant amount of time and/or battery power to crank. In this case, the components determined during the last running of the engine can be used without significantly changing the response. This calibration procedure can also be performed at any time during normal operation of the engine if the solenoid 38 can be activated while the flow of fuel to the injector 30 is shut off. On most engines, this can be accomplished because the injector 30 normally operates only about 10% of the time. This leaves about 90% of time between injection events during which the injector 30 is not needed. There is therefore usually a short period of time between the operation of each injector during which the fuel can be shut off without affecting the operation of the engine, especially if the engine is idling or running at a slow speed. The time required to perform this calibration step depends only on the time taken by the second valve 35 to open and close.

Engines with more than eight cylinders, on the other hand, will only leave about 20% of time between injection events to perform this calibration. This can be compensated for, however, by installing two fuel control solenoids, one for half the injectors and another for the other half. One injector 30 in each half set can then be calibrated in any order required until all injectors are calibrated without preventing any injector from activating when required. Compensation for the movement of the second valve 35 is performed by adding the output of the lookup table values to the output of the solenoid current-to-voltage converter 58 at the same input of the differential amplifier 60 listed above, and therefore both components are subtracted from the sensor output yielding only the component as a result of the movement of the needle valve 25 at the output of the differential amplifier 60.

The magnetic field of the solenoid 38 does not change significantly with temperature, and is a direct function of a specific amount of current through the solenoid 38. Because this magnetic field does not change with temperature, for a given amount of solenoid current the only thing that will change the sensor output is temperature. The apparatus 20 according to the present invention also advantageously determines change in sensor offset and gain by periodically energizing the solenoid 38 without moving the second valve 35 or the needle valve 25 and determining the sensor response. This can be accomplished by generating a current through the solenoid 38 that is not strong enough to open the second valve 35 so that neither the second valve 35 nor the needle valve 25 move. This can be performed, for example, at any time that the injector 30 is not needed to inject fuel. The process of compensating for changes in offset is performed separately from the process of compensating for changes of gain.

To compensate for any changes in offset, for example, the sensor output can be sampled at any time that the solenoid 38 is not energized and the valves are not open. This offset can be first acquired when the engine controller 50 is first activated immediately after the engine is switched on or as it is being started and then stored in the memory device 51. At some later time, the output of the sensor 40 is again sampled with neither the solenoid 38 nor the valves 25, 35 activated. The difference between the offset during this subsequent period and the offset first determined upon startup is then calculated by digital subtraction. This yields an amount of change in offset proportional to temperature. This amount of change is then added to each value in the lookup table used to compensate for the movement of the second valve 35. This offset is then subtracted from the sensor signal in the differential amplifier 60 as is done with the solenoid component and the second valve component.

To compensate for any change in gain, the solenoid 38 is activated with a small, precisely controlled current that is not strong enough to open the second valve 35. The sensor output is therefore only proportional to the solenoid's magnetic field. This controlled current generates a specific quantity of magnetic flux density that does not change significantly with temperature. This is first done when the engine is first started, and the difference between the sensor output when the solenoid 38 is on at this level is subtracted from the offset value determined as described above. This yields a value corresponding to the sensor output voltage versus magnetic flux density and is stored in memory 51. The subsequent gain value is then subtracted from the original value to yield the change in gain as a function of temperature. This change in gain is then stored as a digital value, and used to control gain of the differential amplifier 60 used to subtract the components of the solenoid magnetic field and the second valve field. This serves to readjust the sensor needle valve output to the same level both when it is at rest and when it is fully open. These steps and construction as described above of the memory 51 and the engine controller 50 form a sensor calibration means to thereby calibrate the sensor output signals responsive to changes in temperature.

After these calibration steps are performed, the output of the differential amplifier 60 is then unaffected by changes in sensor temperature, and the components of the solenoid magnetic field and the second valve magnetic field are subtracted from the output. This yields a stable output that is proportional only to the movement of the needle valve 25. This signal is then connected to a comparator 65 which has a preset voltage level connected to its reference input. This advantageously provides a stable switching point for this comparator 65 which allows it to switch at a specific percentage of the distance that the needle valve 25 opens. The resulting digital signal is then transmitted to the engine controller 50. Also, connected to the engine controller 50 is a crankshaft position sensor 75 that tells the engine controller 50 the rotational position of the engine as a timing signal. The engine controller 50 then uses these two timing signals to determine how long it takes the needle valve 25 to open after the activation of the solenoid 38. It then adjusts the timing of the solenoid activation signal appropriately to achieve the proper timing of the injection event. This process is repeated for each fuel injector 30 of an engine or for each fuel injector 30 of a plurality of engines of a system.

As understood by those skilled in the art, the operation of the differential amplifier 60 and the comparator 65 can be performed by other analog and digital circuits contained in the engine controller 50, e.g., analog-to-digital (A/D) converters 52, 53 and digital circuits. The configuration shown, however, is fairly simple and advantageously can be implemented without adding a lot of processing overhead to the job of the engine controller 50. Also, this system 15 can be used on any injector 30 or other hydraulically activated system with or without a solenoid 38 present if a coil is added to the assembly to generate the magnetic field to be used to compensate for changes in sensor offset and gain caused by changes in temperature.

Additionally, the calibration step that determines the sensor offset and gain can be performed at any time during normal engine operation. The calibration of the change in magnetic field caused by the movement of the second valve 35 can be accomplished at any time if the fuel can be temporarily shut off to the injector 30. This can be accomplished if the engine controller 50 is notified that the injector system 15 needs calibrating and that engine controller 50 should initiate the calibration sequence at the earliest possible convenience. This could be done by momentarily shutting off the fuel to any injector 30 for the length of time needed to calibrate the injector 30. This would not necessarily require that any single injector 30 be deactivated when needed if the fuel can be shut off while the injector 30 is not needed, such as when the piston is in some other position other than the ignition stroke.

For example, each injector 30 could be recalibrated at any time that none of the injectors are being used and the fuel supply can be shut off while no injector is firing. This is relatively easy to accomplish on engines with less than eight cylinders or with engines with dual or multiple control solenoids 38.

Also, some recent injectors, for example, have a pilot or dual stage operation wherein the second valve 35 is only opened to a position approximately halfway at first, then is opened fully for the full fuel injection event. In this type of injector 30, the distance that the second valve 35 moves is directly proportional to the current through the solenoid 38. When capturing the signal component of the second valve 35, this can require a second set of data to be recorded during calibration that relates the distance that the second valve 35 moves to the amount of current through the solenoid 38. This second set of data, relating second valve distance to solenoid current, can be used to recreate the signal component for the second valve 35 when it opens partially instead of opening fully against its spring stop.

Alternatively, in a system where the needle valve 25' of the fuel injector 30' is the only object that moves, a calibration can be performed in this system 15' wherein the component of the magnetic field that is generated by the solenoid 38' is determined by sending a known current through the solenoid 38' that is not strong enough to physically move the needle valve 25'. The magnetic field generated then creates a first output signal from the Hall-effect sensor 40' which is stored by a memory device such as of the controller 50'. The controller 50' then uses an equation relating magnetic flux density to the current through the solenoid 38' and extrapolates to determine the magnetic field that would be produced by the solenoid 38' by the current required to actually open the needle valve 25'. This value is then stored as a constant and subtracted from the resultant sensor signal derived while the fuel injector 30' is running normally and the needle valve 25' is opening due to the higher current through the solenoid 38'.

As still another alternative, if the objects that are to be moved cannot be held in position while calibrating or the current cannot be reduced to the point where the valve rod of the second valve 35" does not move responsive to the solenoid 38", then the valve rod 36" can be magnetized in a specific polarity. For example, the valve rod 36" can be magnetized in a manner so its North pole is inside the solenoid 38". Under normal operation, the solenoid 38" is energized with a current in a direction necessary to cause the solenoid 38" to generate a South polarity field that pulls the rod 36" into the solenoid 38". To calibrate this fuel injection system 15", the magnetic field should be determined without allowing the valve rod 36" to move. To do this, the current through the solenoid 38" is reversed during calibration so the rod 36" is held against a stop and does not move. The resultant magnetic field is therefore only that caused by the current through the solenoid 38". The solenoid current is then allowed to flow in the normal direction, and the resultant sensor output is determined by subtraction of the components as described above.

As illustrated in FIGS. 1-4 and as described above, methods for sensing movement of a first valve 25 of a valve system 15 having the first valve and a second valve 35 positioned upstream from and in fluid communication with the first valve are also provided according to the present invention. An embodiment of a method preferably includes sensing a first valve output signal representative of actuation of a first valve positioned in fluid communication with a fuel pump which pumps fuel to flow to a combustion chamber of an engine and subtracting a second valve calibration output signal representative of actuation of a second valve 35 positioned upstream from and in fluid communication with the first valve and in fluid communication with the fuel pump for allowing fuel to flow to the first valve from the first valve output signal to thereby provide a first valve movement signal representative of a time of movement of the first valve.

The method can also include generating a first actuating calibration signal representative of the actuating of the second valve 35 when the first and second valves are each in a closed position, generating a second actuating calibration signal representative of the actuating of the second valve 35 when the second valve 35 is in an open position and the first valve is in a closed position, and storing the first and second actuating calibration signals so that the combination of the first and second actuating calibration signals thereby provide a second valve calibration output signal. A sensor calibration signal, e.g., an error signal, can also be sensed and subtracted from the first valve output signal.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. An apparatus for sensing movement of a fuel injector valve, the apparatus comprising:

a fuel pump for pumping fuel to flow to a combustion chamber of an engine;

first valve means positioned in fluid communication with said fuel pump for allowing fuel to flow directly into the combustion chamber when in an open position;

second valve means positioned in fluid communication with said first valve means and said fuel pump for allowing fuel to flow to said first valve means when in an open position;

second valve actuating means responsive to desired fuel injection for actuating said second valve means;

sensing means positioned responsive to movement of said first and second valve means and to actuation of said second valve actuating means for sensing movement of said first and second valve means and actuation of said second valve actuating means; and movement differentiating means responsive to said sensing means for differentiating a time of movement of only said first valve means from movement of said second valve means and actuation of said second valve actuating means.

2. An apparatus as defined in claim 1, wherein said movement differentiating means includes subtracting means responsive to a movement output signal generated by said sensing means, a second valve output signal generated by said second valve means, and a second valve actuating output signal generated by said second valve actuating means for subtracting the second valve output signal and the second valve actuating output signal from the movement output signal to thereby provide a first valve movement timing signal representative of a time of opening of said first valve means.

3. An apparatus as defined in claim 2, wherein said movement differentiating means further includes calibration generating means in communication with said subtracting means for generating a calibration signal representative of the movement of said second valve means and the actuation of said second valve actuating means and storing means responsive to said calibration generating means for storing the calibration signal.

4. An apparatus as defined in claim 3, wherein said calibration generating means includes a fuel shutoff valve positioned in fluid communication with said fuel pump and said second valve means for preventing fuel to flow to said second valve means when in a closed position and for allowing fuel to flow to said second valve means when in an open position and control means connected to said second valve actuating means for controlling actuation of said second valve actuating means when said fuel shutoff valve and said second valve means are each in a closed position and when said fuel shutoff valve is in a closed position and said second valve means is in an open position to thereby generate the calibration signal.

5. An apparatus as defined in claim 4, wherein said control means is further positioned in communication with said fuel shutoff valve for controlling the opening and closing of said fuel shutoff valve.

6. An apparatus as defined in claim 1, wherein said second valve actuating means comprises a solenoid, and wherein said first valve means comprises a needle valve.

7. An apparatus as defined in claim 1, wherein said sensing means comprises at least one magnetic-field sensor for sensing a magnetic field generated by movement of said first valve means, a magnetic field generated by movement of said second valve means, and a magnetic field generated by said second valve actuating means.

8. An apparatus as defined in claim 1, wherein further comprising at least portions of an engine controller in communication with said sensing means for controlling the igniting of an engine and sensor calibrating means in communication with said engine controller and said sensing means for calibrating said sensing means responsive to changes in temperature to provide a calibrated sensing means output signal.

9. An apparatus as defined in claim 8, wherein said sensor calibration means responsively adjusts an offset signal and a gain signal of said sensing means.

10. An apparatus for sensing movement of a fuel injector valve, the apparatus comprising:

a fuel pump for pumping fuel to flow to a combustion chamber of an engine;

a first valve positioned in fluid communication with said fuel pump for allowing fuel to flow into the combustion chamber when in an open position;

a second valve positioned in fluid communication with said first valve and said fuel pump for allowing fuel to flow to said first valve when in an open position;

a solenoid responsive to a predetermined fuel injection signal for supplying a magnetic field adjacent said second valve to thereby actuate said second valve;

a sensor positioned to sense movement of said first and second valves and actuation of said solenoid and for respectively providing a first valve output signal, a second valve output signal, and a solenoid output signal; and a differentiator responsive to the first valve movement output signal, the second valve movement output signal, and the solenoid output signal for differentiating the first valve movement output signal from the second valve movement output signal and the solenoid output signal to thereby provide a first valve movement timing signal representative of a time of opening of said first valve.

11. An apparatus as defined in claim 10, further comprising calibration generating means for generating a solenoid actuating calibration signal representative of the actuating of said second valve and storing means for storing the solenoid actuating calibration signal.

12. An apparatus as defined in claim 11, wherein said calibration generating means includes a fuel shutoff valve positioned in fluid communication with said fuel pump and said second valve for preventing fuel to flow to said second valve when in a closed position and for allowing fuel to flow to said second valve when in an open position and control means connected to said solenoid actuating means for controlling actuation of said solenoid when said fuel shutoff valve and said second valve are each in a closed position and when said fuel shutoff valve is in a closed position and said second valve is in an open position to thereby generate the solenoid actuating calibration signal.

13. An apparatus as defined in claim 12, wherein said processing means includes subtracting means responsive to a first valve output signal generated when said first and second valves are each in an open position and the solenoid actuating calibration signal for subtracting the solenoid actuating calibration signal from the first valve output signal to thereby provide a first valve timing signal representative of the time of the opening of said first valve.

14. An apparatus as defined in claim 13, further comprising sensor calibration generating means responsive to said processing means and said sensor for generating a calibration sensing means signal, and wherein said subtracting means further subtracts the calibration sensor signal from the first valve output signal.

15. An apparatus as defined in claim 14, wherein control means is further positioned in communication with said fuel shutoff valve and said solenoid for controlling the opening and closing of said fuel shutoff valve and the actuation of said solenoid.

16. An apparatus as defined in claim 15, wherein said first valve comprises a needle valve, and wherein said sensor comprises a magnetic-field sensor for sensing a magnetic field generated by movement of said needle valve, a magnetic field generated by movement of said second valve, and a magnetic field generated by said solenoid.

17. An apparatus for sensing movement of a first valve of a valve system having the first valve and a second valve positioned upstream from and in fluid communication with the first valve, the apparatus comprising:

second valve actuating means for actuating the second valve;

sensing means responsive to movement of at least the first valve for sensing opening of the first valve and responsive to said second valve actuating means for sensing actuation of said second valve actuating means; and movement differentiating means responsive to said sensing means for differentiating a time of opening of said first valve means, said movement differentiating means including processing means responsive to said sensing means for processing a signal representative of actuation of said second valve actuating means and a signal representative of movement of the first valve to thereby provide a first valve movement timing signal representative of a time of opening of the first valve.

18. An apparatus as defined in claim 17, wherein said movement differentiating means further includes calibration generating means for generating a calibration signal representative of the actuating of the second valve and storing means for storing the second valve actuating calibration signal.

19. An apparatus as defined in claim 18, wherein said calibration generating means includes a fluid shutoff valve positioned upstream from and in fluid communication with the second valve for preventing fluid to flow to the second valve when in a closed position and for allowing fluid to flow to the second valve when in an open position and control means connected to said second valve actuating means for controlling actuation of said second valve actuating means when said fluid shutoff valve and said second valve are each in a closed position and when said fluid shutoff valve is in a closed position and said second valve is in an open position to thereby generate the second valve actuating calibration signal.

20. An apparatus as defined in claim 19, wherein said processing means includes subtracting means responsive to a first valve output signal generated when said first and second valves are each in an open position and the second valve actuating calibration signal for subtracting the second valve actuating calibration signal from the first valve output signal to thereby provide a first valve timing signal representative of the time of the opening of said first valve.

21. An apparatus as defined in claim 20, wherein said movement differentiating means further includes sensing calibration generating means responsive to said processing means and said sensing means for generating a calibration sensing means signal, and wherein said subtracting means further subtracts the calibration sensing means signal from the first valve output signal.

22. An apparatus as defined in claim 21, wherein said control means is further positioned in communication with said fluid shutoff valve and said second valve actuating means for controlling the opening and closing of said fluid shutoff valve and the actuation of said second valve actuating means.

23. An apparatus as defined in claim 22, wherein said second valve actuating means comprises a solenoid.

24. An apparatus as defined in claim 23, wherein said sensing means comprises a magnetic-field sensor for sensing a magnetic field generated by movement of the first valve, a magnetic field generated by movement of the second valve, and a magnetic field generated by said solenoid.

25. A method for sensing movement of a fuel injector valve of a fuel injection system for a combustion engine, the method comprising:

sensing a first valve output signal representative of actuation of a first valve positioned in fluid communication with a fuel pump which pumps fuel to flow to a combustion chamber of an engine; and subtracting a second valve calibration output signal representative of actuation of a second valve positioned upstream from and in fluid communication with the first valve and in fluid communication with the fuel pump for allowing fuel to flow to the first valve from the first valve output signal to thereby provide a first valve movement signal representative of a time of movement of the first valve.

26. A method as defined in claim 25, further comprising generating a first actuating calibration signal representative of the actuating of the second valve when the first and second valves are each in a closed position, generating a second actuating calibration signal representative of the actuating of the second valve when the second valve is in an open position and the first valve is in a closed position, and storing the first and second actuating calibration signals so that the combination of the first and second actuating calibration signals thereby provide a second valve calibration output signal.

27. A method as defined in claim 25, further comprising sensing an error signal representative of error from a sensor positioned to sense movement of the first and second valves and subtracting the error signal from the first valve output signal.

28. A method for sensing movement of a first valve of a valve system having the first valve, a second valve positioned upstream from and in fluid communication with the first valve, and second valve actuating means for actuating the second valve, the method comprising:

sensing a second valve actuating signal from the second valve actuating means;

sensing a first valve output signal from the first valve; and subtracting the second valve actuating signal from the first valve output signal to thereby provide a first valve movement signal representative of a time of movement of the first valve.

29. A method as defined in claim 28, further comprising sensing an error signal representative of error from a sensor positioned to sense movement of the first and second valves and subtracting the error signal from the first valve output signal.

30. A method for sensing movement of a first valve of a fuel injector system having the first valve, a second valve positioned upstream from and in fluid communication with the first valve, and a solenoid for magnetically actuating the second valve, the method comprising:

sensing a calibrated second valve actuating signal from the solenoid;

sensing a calibrated second valve output signal from the second valve;

sensing a first valve output signal from the first valve, the second valve, and the solenoid; and subtracting the calibrated second valve actuating signal and the calibrated second valve output signal from the first valve output signal to thereby provide a first valve movement signal representative of a time of movement of the first valve.

31. A method as defined in claim 30, further comprising sensing a sensor calibration signal from a sensor positioned to sense movement of the first and second valves and subtracting the sensor calibration signal from the first valve output signal.

* * * * *

UNITED STATES PATENT AND TRADEMARK OFFICE
CERTIFICATE OF CORRECTION

PATENT NO. : 5,738,071
DATED : April 14, 1998
INVENTOR(S) : SMITH JR. ET AL.

It is certified that error appears in the above-identified patent and that said Letters Patent is hereby corrected as shown below:

On the Cover Page    Please insert -- Related U.S. Application Data: Continuation-in-part of U.S. Serial No. 08/471,192 filed June 7, 1995, now U.S. Patent No. 5,670,886, which is a continuation-in-part of U.S. Serial No. 07/703,269 filed May 22, 1991, now U.S. Patent No. 5,459,405.--

Column 1 before the Background of the Invention    Please insert -- This application is a continuation-in-part of U.S. Serial No. 08/471,192 filed June 7, 1995, now U.S. Patent No. 5,670,886, which is a continuation-in-part of U.S. Serial No. 07/703,269 filed May 22, 1991, now U.S. Patent No. 5,459,405.--

Signed and Sealed this

Twenty-fourth Day of April, 2001

*Attest:*

NICHOLAS P. GODICI

*Attesting Officer*    *Acting Director of the United States Patent and Trademark Office*